United States Patent [19]
Ichihara

[11] Patent Number: 5,491,453
[45] Date of Patent: Feb. 13, 1996

[54] NARROW-BAND FILTER HAVING A VARIABLE CENTER FREQUENCY

[75] Inventor: Masaki Ichihara, Tokyo, Japan

[73] Assignee: NEC Corporation, Tokyo, Japan

[21] Appl. No.: 194,316

[22] Filed: Feb. 10, 1994

[30] Foreign Application Priority Data

Feb. 10, 1993 [JP] Japan .................... 5-022211

[51] Int. Cl.⁶ .................................................. H04B 1/10
[52] U.S. Cl. .......................... 327/553; 327/554; 327/45; 330/305; 377/52
[58] Field of Search ................................ 307/520, 521, 307/260, 262, 269, 271; 377/44, 46, 47, 52, 107; 328/167; 330/305

[56] References Cited

U.S. PATENT DOCUMENTS

| 3,857,104 | 12/1974 | Sacks | 327/558 |
| 4,502,049 | 2/1985 | Atkinson | 327/46 |
| 5,206,549 | 4/1993 | Suzuki et al. | 377/47 |
| 5,313,509 | 5/1994 | Tomita | 377/52 |

Primary Examiner—Timothy P. Callahan
Assistant Examiner—Dinh T. Le
Attorney, Agent, or Firm—Sughrue, Mion, Zinn, Macpeak & Seas

[57] ABSTRACT

In a narrow-band filter for filtering an input signal having a predetermined frequency and comprising first through n-th low-pass filters (13-1 to 13-n) which are connected in parallel to one another, a switching circuit time divisionally connects the first through the n-th low-pass filters between input and output terminals (11, 12). The first through the n-th low-pass filters, thereby, time divisionally filters the input signal for first through n-th filtering durations, respectively. A control circuit (30) is supplied with a frequency designation signal designating the predetermined frequency and controls the switching circuit to change at least one of the first through the n-th filtering durations in accordance with the frequency designation signal.

7 Claims, 10 Drawing Sheets

NARROW-BAND FILTER HAVING A VARIABLE CENTER FREQUENCY

BACKGROUND OF THE INVENTION

This invention relates to a narrow-band filter having a variable center frequency. Such a narrow-band filter is particularly useful for detecting a plurality of tone signals which have different frequencies.

In general, a narrow-band filter comprises an input terminal supplied with an input signal having a predetermined frequency, an output terminal, first through n-th low-pass filters which are connected in parallel to one another, where n represents a first positive integer greater than unity, a switching circuit connected to the first through the n-th low-pass filters, and a control circuit for controlling the switching circuit. The first through the n-th low-pass filters have the same filter characteristic and are collectively called an n-path filter. The control circuit delivers first through n-th switch driving signals to the switching circuit. Supplied with the first through the n-th switch driving signals, the switching circuit time divisionally connects the first through the n-th low-pass filters one by one between the input and the output terminals at a predetermined period Tp. As a result of switching operation of the switching circuit, the first through the n-th low-pass filters time divisionally filtering the input signal for first through n-th filtering durations, respectively. The first through the n-th filtering durations are equal to one another. In this event, the narrow-band filter has a single center frequency fc. Such a narrow-band filter is disclosed in Japanese Unexamined Patent Prepublication No. 16013/1985 (Tokkai Shô 60-16013).

In the meantime, a mobile radio telephone system of an AMPS type uses an SAT (Supervisory Audio Tone) signal in order to monitor a connection state of a radio channel. The SAT signal is carried by a radio signal and has one of first through third tone frequencies which are equal to 5970 (Hz), 6000 (Hz), and 6030 (Hz), respectively, and which are assigned to base stations. Let the mobile radio telephone system comprise first through third base stations which are assigned with the first through the third tone frequencies, respectively. When the first base station transmits the SAT signal having the first tone frequency, a mobile station receives the SAT signal transmitted from the first base station. When the mobile station detects the first tone frequency of the SAT signal, the mobile station transmits a transmission signal, as an answer back signal, having a frequency equal to the first tone frequency. On reception of the transmission signal having the frequency equal to the first tone frequency, the first base station confirms the fact that the radio channel is connected to the mobile station.

As apparent from the above description, the mobile station must discriminate a tone frequency among the first through the third tone frequencies. The narrow-band filter mentioned above is particularly useful for detecting the tone frequency. However, the mobile station must be provided with first through third narrow-band filters having first through third center frequencies which are equal to the first through the third tone frequencies, respectively. This is because the narrow-band filter detects a single tone frequency only. This means that the mobile station requires a receiver circuit of a large size for discriminating the tone frequency among the first through the third tone frequencies.

SUMMARY OF THE INVENTION

It is therefore an object of this invention to provide a narrow-band filter which is capable of changing a center frequency in a narrow range.

It is another object of this invention to provide a narrow-band filter of the type described without increment of a circuit size.

Other object of this invention will become clear as the description proceeds.

On describing the gist of this invention, it is possible to understand that a narrow-band filter is supplied with an input signal having a predetermined frequency through an input terminal. The narrow-band filter filters the input signal and produces a filtered signal through an output terminal. The narrow-band filter comprises first through n-th low-pass filters which are connected in parallel to one another, where n represents a positive integer greater than unity, and switching means connected to the first through the n-th low-pass filters for time divisionally connecting the first through the n-th low-pass filters between the input and the output terminals. The first through the n-th low-pass filters time divisionally filters the input signal for first through n-th filtering durations, respectively, and produces first through n-th time division filtered signals, respectively, collectively as the filtered signal. The narrow-band filter further comprises control means connected to the switching means and supplied with a frequency designation signal designating the predetermined frequency for controlling the switching means to change at least one of the first through the n-th filtering durations in accordance with the frequency designation signal.

DESCRIPTION OF THE PREFERRED EMBODIMENT

Figure 1:
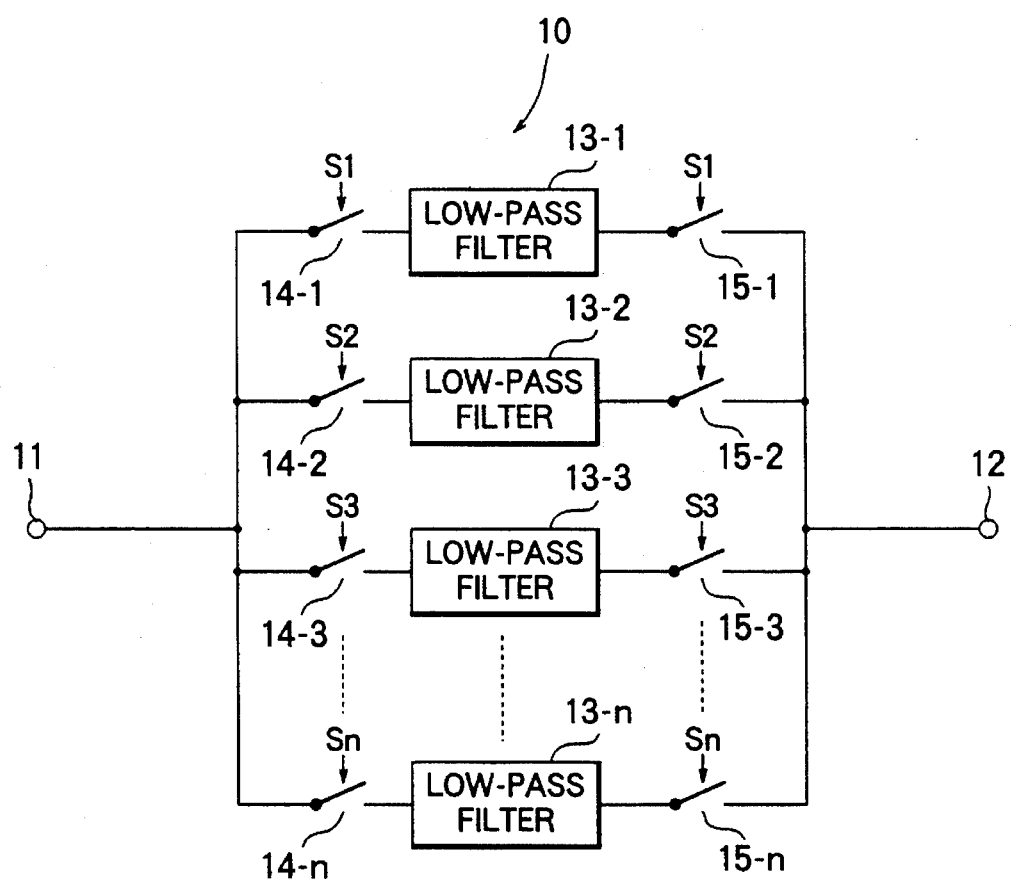
FIG. 1 is a block diagram of a conventional narrow-band filter.
Figure 1:
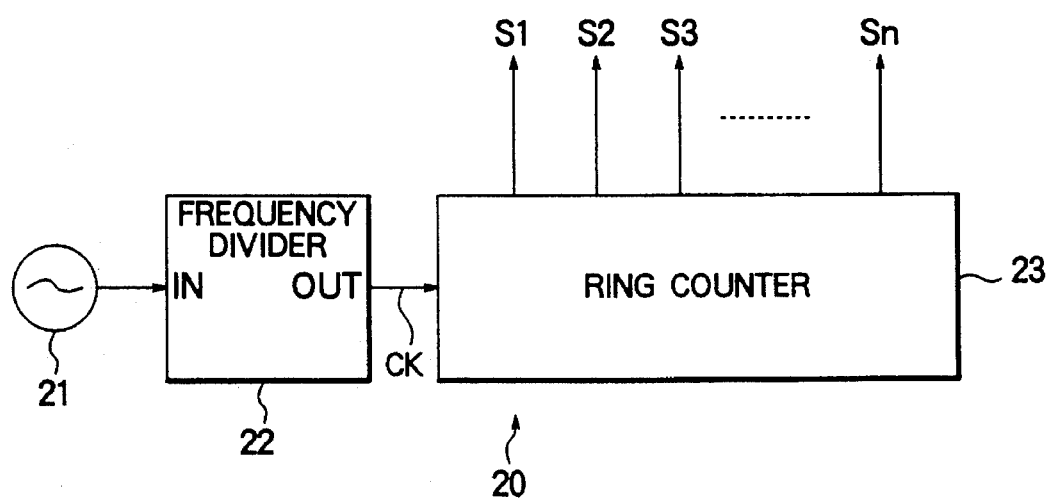
Figure 2:
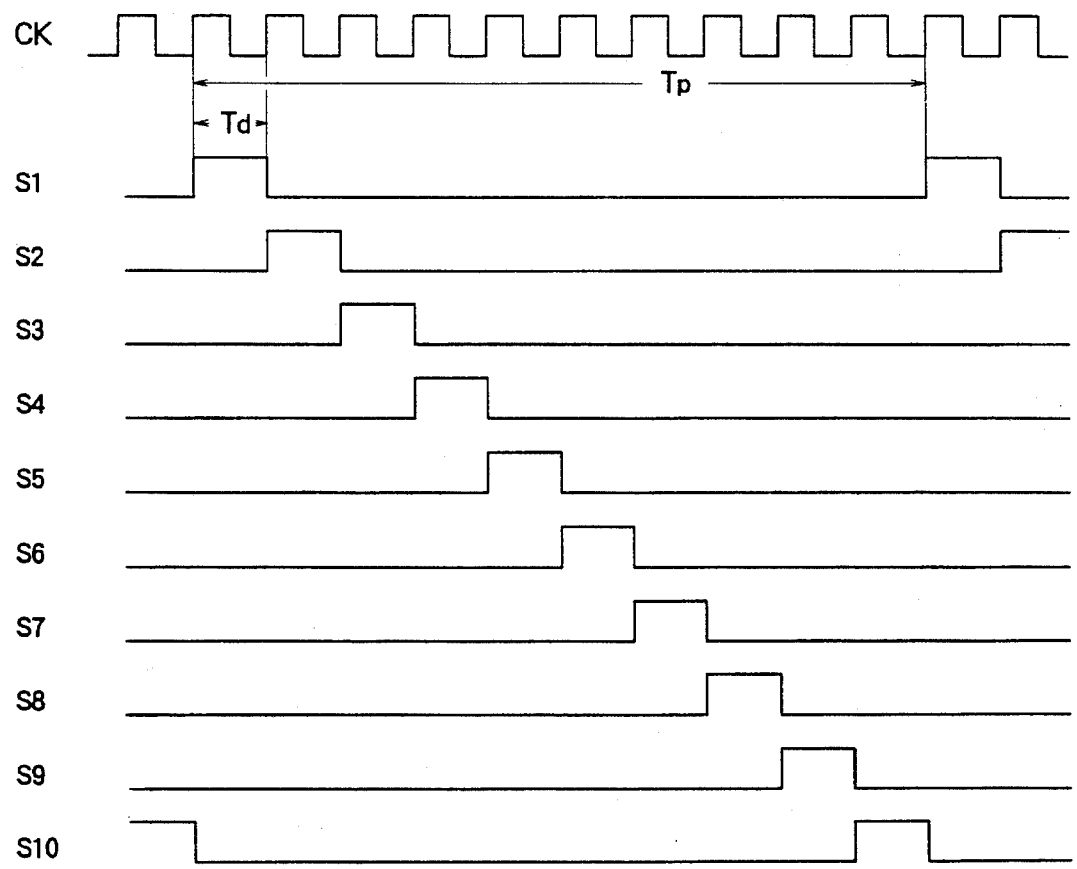
FIG. 2 shows signal waveforms for use in describing operation of the narrow-band filter illustrated in FIG. 1.

Referring to FIGS. 1 and 2, a conventional narrow-band filter will be described at first in order to facilitate an understanding of the present invention. In FIG. 1, the narrow-band filter comprises a filter circuit 10 which is called an n-pass filter and a control circuit 20. The filter circuit 10 is for filtering an input signal having a predetermined frequency fi and produces a filtered signal. The filter circuit 10 comprises an input terminal 11 supplied with the input signal, an output terminal 12, and first through n-th low-pass filters 13-1 to 13-n which are connected in parallel to one another, where n represents a first positive integer greater than unity. The first through the n-th low-pass filters 13-1 to 13-n have the same filter characteristic, for example, the same cutoff frequency of 3 dB.

The filter circuit 10 further comprises first through n-th input switches 14-1 to 14-n which are connected between the input terminal 11 and the first through the n-th low-pass filters 13-1 to 13-n and first through n-th output switches 15-1 to 15-n which are connected between the output terminal 12 and the first through the n-th low-pass filters 13-1 to 13-n. The first through the n-th input switches 14-1 to 14-n and the first through the n-th output switches 15-1 to 15-n may collectively be called a switching circuit.

As will later be described, the switching circuit is controlled by the control circuit 20 and time divisionally connects the first through the n-th low-pass filters 13-1 to 13-n one by one between the input and the output terminals 11 and 12.

The control circuit 20 comprises an oscillator 21, a frequency divider 22 connected to the oscillator 21, and a ring counter 23 connected to the frequency divider 22. The oscillator 21 generates a reference clock signal having a reference frequency f0. The frequency divider 22 frequency divides the reference clock signal by a predetermined frequency dividing ratio 1/m where m represents a second positive integer greater than unity. The frequency divider 22 delivers a divided clock signal CK having a divided frequency fr given by f0/m to the ring counter 23. The divided clock signal CK is illustrated at a top line of FIG. 2. Supplied with the divided clock signal CK, the ring counter 23 counts the number of clocks of the divided clock signal CK and time divisionally generates first through n-th count signals in the manner known in the art. The ring counter 23 supplies the first through the n-th count signals, as first through n-th switch driving signals S1 to Sn, to the first through the n-th input switches 14-1 to 14-n, respectively, and to the first through the n-th output switches 15-1 to 15-n, respectively.

In FIG. 2, the first through a tenth switch driving signals S1 to S10 are illustrated on the supposition that first integer n is equal to 10. The first through the tenth switch driving signals S1 to S10 have the same driving frequency fp and have first through tenth high level durations, respectively, defined by a high level, namely, a logic one value. Each of the first through the tenth high level durations lasts a constant time duration Td and which repeats at a predetermined period Tp. It should be noted here that the first through the tenth high level durations never overlap on a time base. In other words, the first through the tenth switch driving signals S1 to S10 have first through tenth phases which are different from one another.

Turning back to FIG. 1, the first through the n-th input switches 14-1 to 14-n are put into an on state by the first through the n-th switch driving signals S1 to Sn, respectively. The first through the n-th output switches 15-1 to 15-n are also put into an on state by the first through the n-th switch driving signals S1 to Sn, respectively. For example, the first input and the first output switches 14-1 and 15-1 are put into the on state at the same time by the first switch driving signal S1. As a result, the first low-pass filter 13-1 is connected between the input and the output terminals 11 and 12 in a time period during which the first input and the first output switches 14-1 and 15-1 are put into the on state. In other words, the first low-pass filter 13-1 filters the input signal for a first filtering duration which corresponds to the first high level duration and which is equal to the constant time duration Td. The first low-pass filter 13-1 delivers a first time division filtered signal to the output terminal 12.

Next, the second input and the second output switches 14-2 and 15-2 are put into the on state at the same time by the second switch driving signal S2. The second low-pass filter 13-2 is connected between the input and the output terminals 11 and 12 in a time period during which the second input and the second output switches 14-2 and 15-2 are put into the on state. Thus, the second low-pass filter 13-2 filters the input signal for a second filtering duration which corresponds to the second high level duration and which is equal to the constant time duration Td. The second low-pass filter 13-2 delivers a second time division filtered signal to the output terminal 12.

Similarly, the third through the n-th low-pass filters 13-3 to 13-n filter the input signal, in order, for third through n-th filtering durations which are equal to the constant time duration Td. It should be noted here that the first through the n-th filtering durations are equal to the constant time duration Td and never overlap on the time base. This means that the first through the n-th low-pass filters 13-1 to 13-n time divisionally filter the input signal and produce the first through the n-th time division filtered signals, respectively, collectively as the filtered signal. In the manner mentioned above, the narrow-band filter has a narrow-band filter characteristic defined by a center frequency fc. The narrow-band filter is, in general, called a narrow-band n-path filter.

In the narrow-band filter being illustrated, the center frequency fc is equal to the driving frequency fp of the first through the n-th switch driving signals S1 to Sn. Furthermore, a band width of 3 dB of the narrow-band filter is equal to twice the cutoff frequency of 3 dB of the first through the n-th low-pass filters 13-1 to 13-n. On the other hand, the driving frequency fp is related to the divided frequency fr mentioned in conjunction with the frequency divider 22 and is defined by a first equation given by:

$$fp\ (=fc)=fr/n. \quad (1)$$

As mentioned in conjunction with the frequency divider 22, the divided frequency fr is defined by a second equation given by:

$$fr=f0/m. \quad (2)$$

From the first and the second equations (1) and (2), the center frequency fc is defined by a third equation given by:

$$fc=fr/n=f0/(m \times n). \quad (3)$$

In addition, it is desirable that the first positive integer n is equal to ten at most in order to minimize the size of the narrow-band filter.

Taking the above into consideration, if the oscillator 21 is implemented by a crystal oscillator, the reference clock signal has a precise frequency equal to the reference frequency f0. As a result, the center frequency fc can be set at a correct value. Furthermore, if the cutoff frequency of 3 dB of the first through the n-th low-pass filters 13-1 to 13-n is set at a low value, it is possible to narrow the band width of 3 dB of the narrow-band filter. This means that the narrow-band filter is particularly useful for detecting the input signal having the predetermined frequency equal to the center frequency fc. Under the circumstances, the narrow-band filter comprising the n-path filter is used for detecting a tone signal.

In the meantime, a mobile radio telephone system of an AMPS type uses an SAT (Supervisory Audio Tone) signal in order to monitor a connection state of a radio channel. The SAT signal is carried by a radio signal and has one of first through third tone frequencies which are equal to 5970 (Hz), 6000 (Hz), and 6030 (Hz), respectively. A frequency difference between the first and the second tone frequencies is an extremely small value which is equal to 30 (Hz) and is 0.5 (%) relative to the second tone frequency. This applies to the frequency difference between the second and the third tone frequencies. The first through the third tone frequencies are assigned to base stations which have different radio communication areas. Let the mobile radio telephone system comprise first through third base stations which have first through third radio communication areas and which use the first through the third tone frequencies, respectively. If the first base station transmits the SAT signal having the first tone frequency, a mobile station located in the first radio communication area receives the SAT signal transmitted from the first base station. When the mobile station detects the first tone frequency of the SAT signal, the mobile station transmits a transmission signal, as an answer back signal, having a frequency equal to the first tone frequency. On reception of the transmission signal having the frequency equal to the first tone frequency, the first base station confirms the fact that the radio channel is connected to the mobile station.

As apparent from the above description, the mobile station must discriminate a tone frequency among the first through the third tone frequencies. The narrow-band filter mentioned above is used in a receiver circuit of the mobile station for detecting a predetermined one of the first through the third tone frequencies. In order to discriminate the tone frequency among the first through the third tone frequencies, the mobile station must be provided with first through third narrow-band filters having first through third center frequencies which are equal to the first through the third tone frequencies, respectively. This means that the mobile station requires the receiver circuit which is expensive and which has a large size in order to discriminate the tone frequency among the first through the third tone frequencies.

In order to dissolve the above-mentioned disadvantage, it will be supposed to time divisionally detect the first through the third tone frequencies by changing the center frequency fc. In order to change the center frequency fc, the following methods will be considered taking the third equation (3) mentioned before into consideration.

In a first method, the reference frequency f0 is changed. In a second method, the first positive integer n is changed. In a third method, the second positive integer m is changed. In the first method, it is required to use an oscillator of a variable frequency type. This means that it is impossible to use the crystal oscillator having a high accuracy. As a result, the reference frequency becomes unstable. In order to stabilize the reference frequency, it will be considered that the oscillator is combined with a PLL (Phase Lock Loop) circuit. In this case, the narrow-band filter requires a complex analog circuit for the PLL circuit.

In the second method, it is hard to change the center frequency by 0.5 (%), namely, 30 (Hz), even if the first positive integer n is changed. This is because the first positive integer n is equal to ten at most as mentioned in conjunction with the equation (3). In the third method, it is required that the second positive integer m is greater than 200 in order to change the center frequency by 0.5 (%). If the center frequency fc, the first positive integer n, and the second positive integer m are equal to 6000 (Hz), 10, and 200, respectively, the reference frequency f0 becomes an extremely high frequency which is equal to 12 (MHz). In this event, the frequency divider 22 must operate in high speed. This means that the frequency divider 22 requires a high power consumption.

Figure 3:
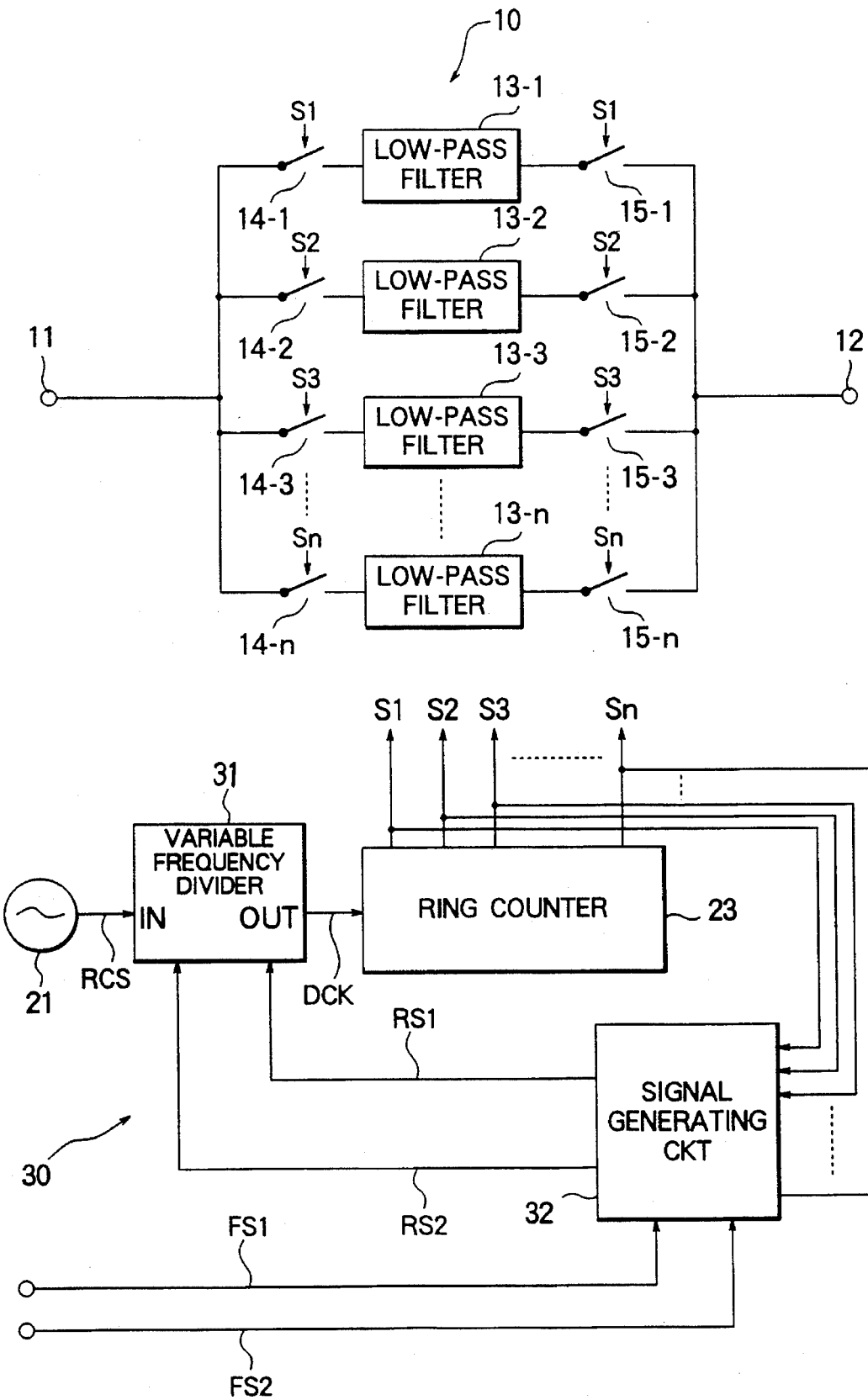
FIG. 3 is a block diagram of a narrow-band filter according to a preferred embodiment of this invention.

Referring to FIG. 3, the description will proceed to a narrow-band filter, namely, a narrow-band n-path filter, according to a preferred embodiment of this invention. The narrow-band filter is particularly useful for detecting three kinds of tone signals which have the first through the third tone frequencies and is therefore included in the receiver circuit of the mobile station. The narrow-band filter comprises similar parts designated by like reference numerals and a control circuit 30 used in place of the control circuit 20. The control circuit 30 comprises similar parts designated by like reference numerals, a variable frequency divider 31 which is used in place of the frequency divider 22, and additionally a signal generating circuit 32. As will later be described, the variable frequency divider 31 frequency divides the reference clock signal by one of first through third frequency dividing ratios of 1/(m−1), 1/m, and 1/(m+1). The first through the third frequency dividing ratios are determined by first and second ratio designation signals RS1 and RS2 supplied from the signal generating circuit 32.

The signal generating circuit 32 is supplied with the first through the n-th switch driving signals S1 to Sn from the ring counter 23 and supplied with first and second frequency designation signals FS1 and FS2 from a micro processor (not shown). As well known in the art, the micro processor controls a transmitter and a receiver in the mobile station. In the example, the micro processor produces the first and the second frequency designation signals FS1 and FS2 in order to designate the frequency dividing ratio. Although the signal generating circuit 32 is supplied with the first through the n-th switch driving signals S1 to Sn, the signal generating circuit 32 utilizes only one of the first through the n-th switch driving signals S1 to Sn as will become clear as the description proceeds. As will shortly be described, the signal generating circuit 32 produces the first and the second ratio designation signals RS1 and RS2 in accordance with the first and the second frequency designation signals FS1 and FS2 and one of the first through the n-th switch driving signals S1 to Sn. Such a signal generating circuit 32 can be implemented by a decoder known in the art. The first and the second frequency designation signals FS1 and FS2 may collectively be called a frequency designation signal. Similarly, the first and the second ratio designation signals RS1 and RS2 may collectively be called a ratio designation signal.

Practically, the micro processor produces the first and the second frequency designation signals FS1 and FS2 so as to designate periodically the first through the third frequency dividing ratios of 1/(m−1), 1/m, and 1/(m+1) one after another at a prescribed period. For example, the micro processor designates at first the first frequency dividing ratio of 1/(m−1) during a first time duration. Next, the micro processor designates the second frequency dividing ratio of 1/m during a second time duration succeeding the first time duration, Subsequently, the micro processor designates the third frequency dividing ratio of 1/(m+1) during a third time duration succeeding the second time duration. The micro processor repeats the above mentioned designation operation at the prescribed period.

Figure 4:
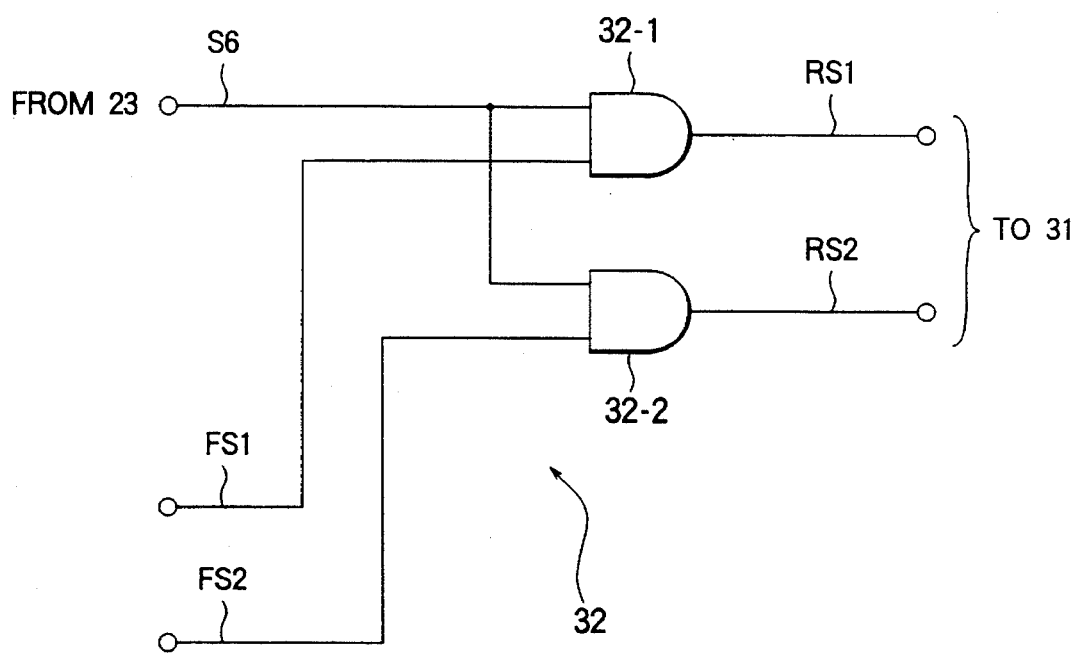
FIG. 4 shows an example of a circuit arrangement in a signal generating circuit illustrated in FIG. 3.

Let the signal generating circuit 32 utilize a sixth switch driving signal S6. In this event, the signal generating circuit 32 is realized by first and second AND gates 32-1 and 32-2 as shown in FIG. 4. In FIG. 4, the first AND gate 32-1 is supplied with the sixth switch driving signal S6 and the first frequency designation signal FS1 while the second AND gate 32-2 is supplied with the sixth switch driving signal S6 and the second frequency designation signal FS2. The first AND gate 32-1 produces the first ratio designation signal RS1 having the logic one value only when both the sixth switch driving signal S6 and the first frequency designation signal FS1 have the logic one value. At this time, the second AND gate 32-2 produces the second ratio designation signal RS2 having the logic zero value. On the other hand, the second AND gate 32-2 produces the second ratio designation signal RS2 having the logic one value only when both the sixth switch driving signal S6 and the second frequency designation signal RS2 have the logic one value. At this time, the first AND gate 32-1 produces the first ratio designation signal RS1 having the logic zero value.

Turning back to FIG. 3, the variable frequency divider 31 selects one of the first through the third frequency dividing ratios of $1/(m-1)$, $1/m$, and $1/(m+1)$ in accordance with the first and the second ratio designation signals RS1 and RS2. In the example being illustrated, the variable frequency divider 31 selects the second frequency dividing ratio of $1/m$ when both the first and the second ratio designation signals RS1 and RS2 have the logic zero value. The variable frequency divider 31 selects the first frequency dividing ratio of $1/(m-1)$ when the first ratio designation signal RS1 has the logic zero value and when the second ratio set signal RS2 has the logic one value. The variable frequency divider 31 selects the third frequency dividing ratio of $1/(m+1)$ when the first ratio designation signal RS1 has the logic one value and when the second ratio designation signal RS2 has the logic zero value.

Figure 5:
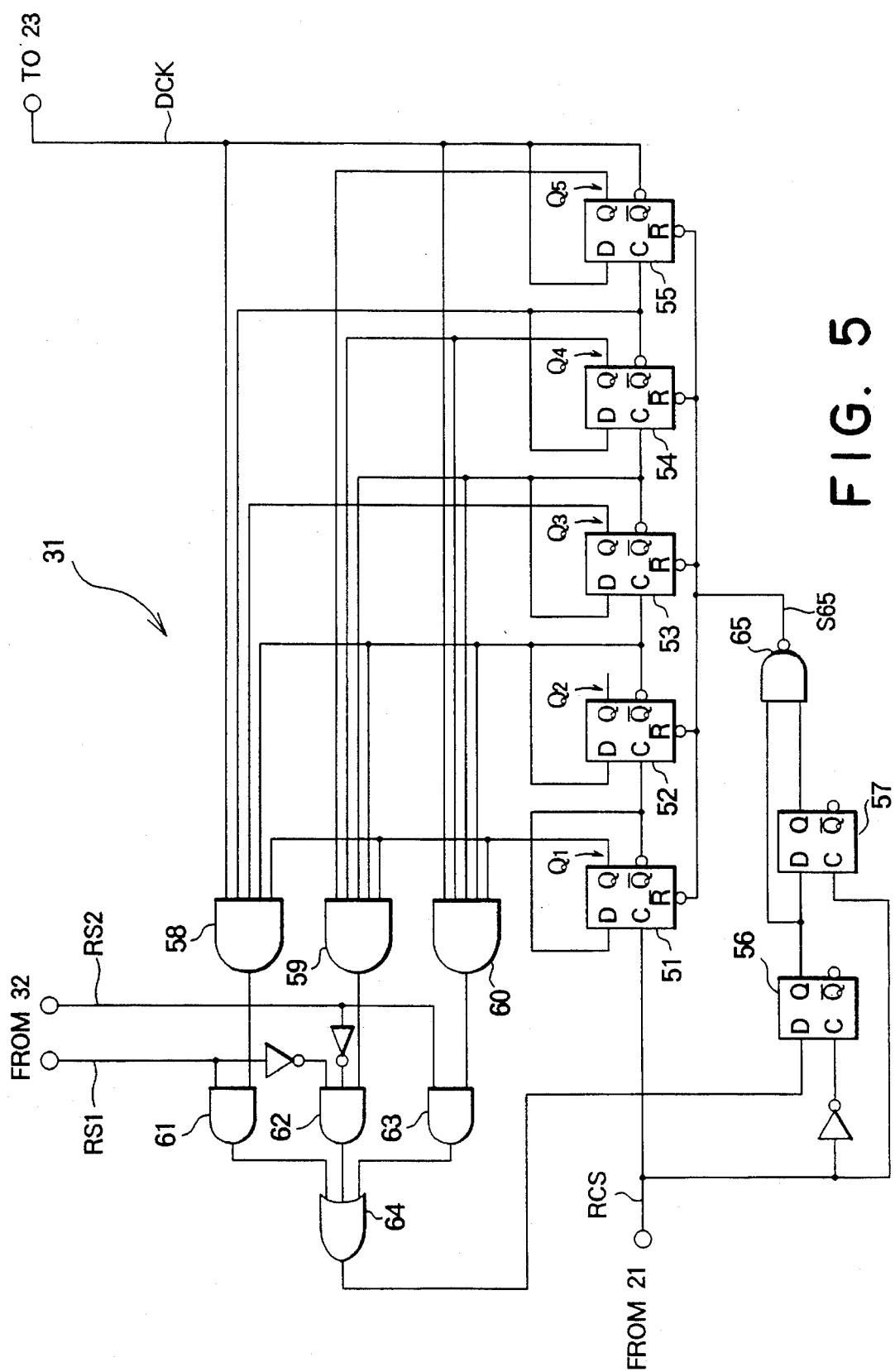
FIG. 5 shows a circuit arrangement of a variable frequency divider illustrated in FIG. 3.

The description will be directed to the case where the reference frequency f0, the first positive integer n, and the second positive integer m are equal to 1200 (kHz), 10, and 20, respectively. In this case, the variable frequency divider 31 implemented by a circuit illustrated in FIG. 5. In FIG. 5, the variable frequency divider 31 comprises first through fifth D-type flip-flop circuits 51 to 55 which are connected in series, sixth and seventh flip-flop circuits 56 and 57, AND gates 58 to 63, an OR gate 64, and an NAND gate 65.

Figure 6:
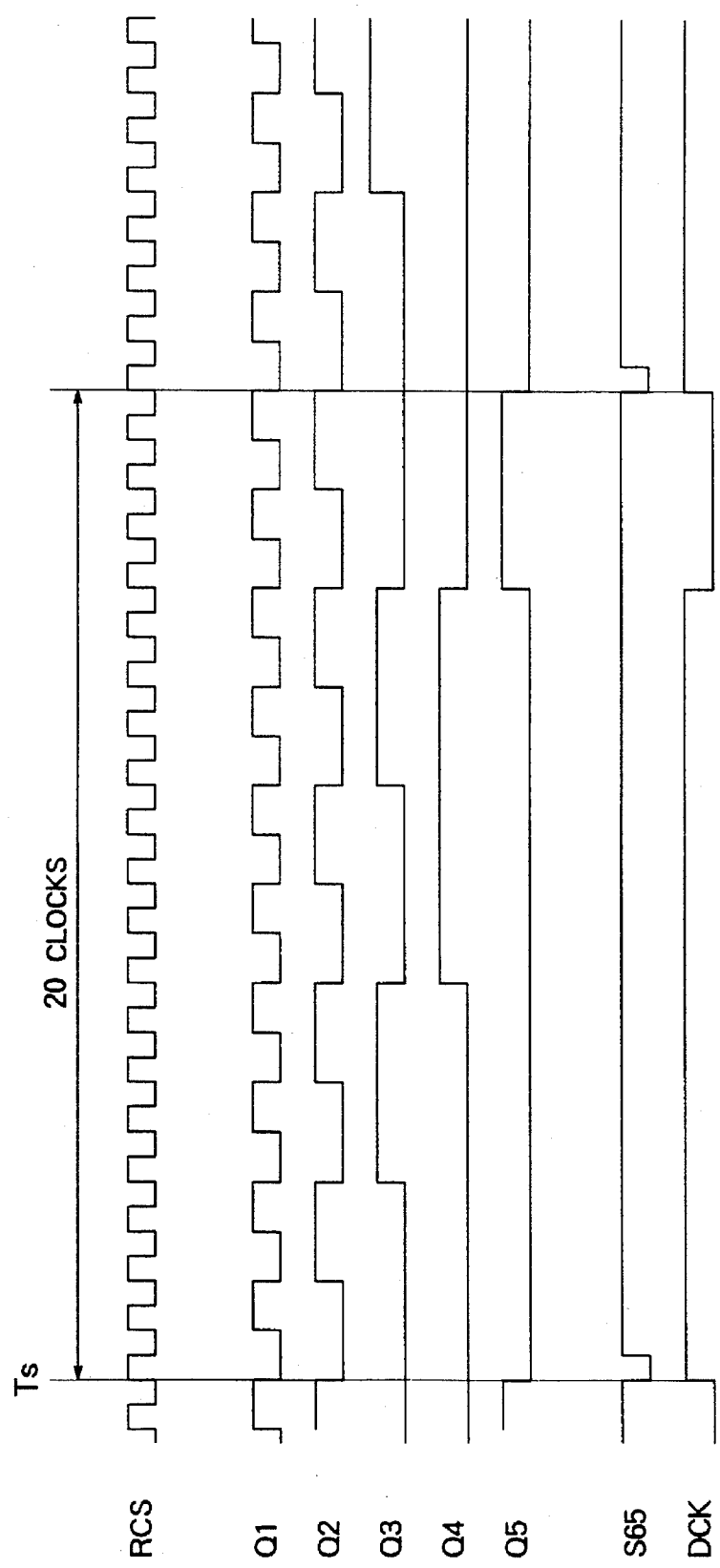
FIG. 6 shows signal waveforms for use in describing first operation of the variable frequency divider illustrated in FIG. 5.

Referring to FIG. 6 together with FIGS. 3 to 5, let the variable frequency divider 31 receive the first and the second ratio designation signals RS1 and RS2 have the logic zero value. The first D-type flip-flop circuit 51 is supplied from the oscillator 21 implemented by the crystal oscillator with the reference clock signal. The reference clock signal is depicted at RCS and illustrated at a top line of FIG. 6. In this event, the first D-type flip-flop circuit 51 produces a first divided signal Q1 wherein the reference clock signal RCS is divided by the frequency dividing ratio of 1/2. The first divided signal Q1 is shown at a second line of FIG. 6. The second D-type flip-flop circuit 52 produces a second divided signal Q2 wherein the reference clock signal RCS is divided by the frequency dividing ratio of 1/4. The second divided signal Q2 is shown at a third line of FIG. 6. Similarly, the third D-type flip-flop circuit 53 produces a third divided signal Q3 which is divided by the frequency dividing ratio of 1/8. The fourth D-type flip-flop circuit 54 produces a fourth divided signal Q4 (shown at a fourth line of FIG. 6) which is divided by the frequency dividing ratio of 1/16. On the other hand, the fifth D-type flip-flop circuit 55 is reset by reset operation before the fifth D-type flip-flop circuit 55 completes frequency dividing operation by the frequency dividing ratio of 1/32. In other words, the fifth D-type flip-flop circuit 55 produces a fifth divided signal Q5 (shown at a sixth line of FIG. 6) in the middle of the frequency dividing operation by the frequency dividing ratio of 1/32 for the following reason.

Namely, the NAND gate 65 produces a gate output signal S65 having the logic zero value at a twentieth clock of the reference clock signal RCS from start of frequency dividing operation. A start time of the frequency dividing operation is depicted at Ts in FIG. 6. By the gate output signal S65 having the logic zero value, the first through the fifth D-type flip-flop circuits 51 to 55 are reset at the same time. As a result of reset operation, the fifth D-type flip-flop circuit 55 produces a divided clock signal DCK through an inverter terminal Q. It should be noted here that the divided clock signal DCK is an inverted signal wherein the fifth divided signal Q5 is inverted in polarity. Moreover, the divided clock signal DCK is a signal wherein the reference clock signal RCS is divided by the frequency dividing ratio of 1/20. Supplied with the divided clock signal DCK defined by the frequency dividing ratio of 1/20, the ring counter 23 delivers the first through the tenth switch driving signals S1 to S10 which are similar to that illustrated in FIG. 2. Supplied with the first through the tenth switch driving signals S1 to S10, the filter circuit 10 carries out the same filtering operation similar to that described in conjunction with FIG. 1. As a result of the above operation, the narrow-band filter has the center frequency which is equal to 6000 ($=1200\times10^3/(20\times 10)$) (Hz). The narrow-band filter can detect the input signal having the predetermined frequency equal to the center frequency. In other words, the narrow-band filter serves as a detector for detecting the input signal, such as a tone signal, having the second tone frequency, as the predetermined frequency, equal to 6000 (Hz).

Figure 7:
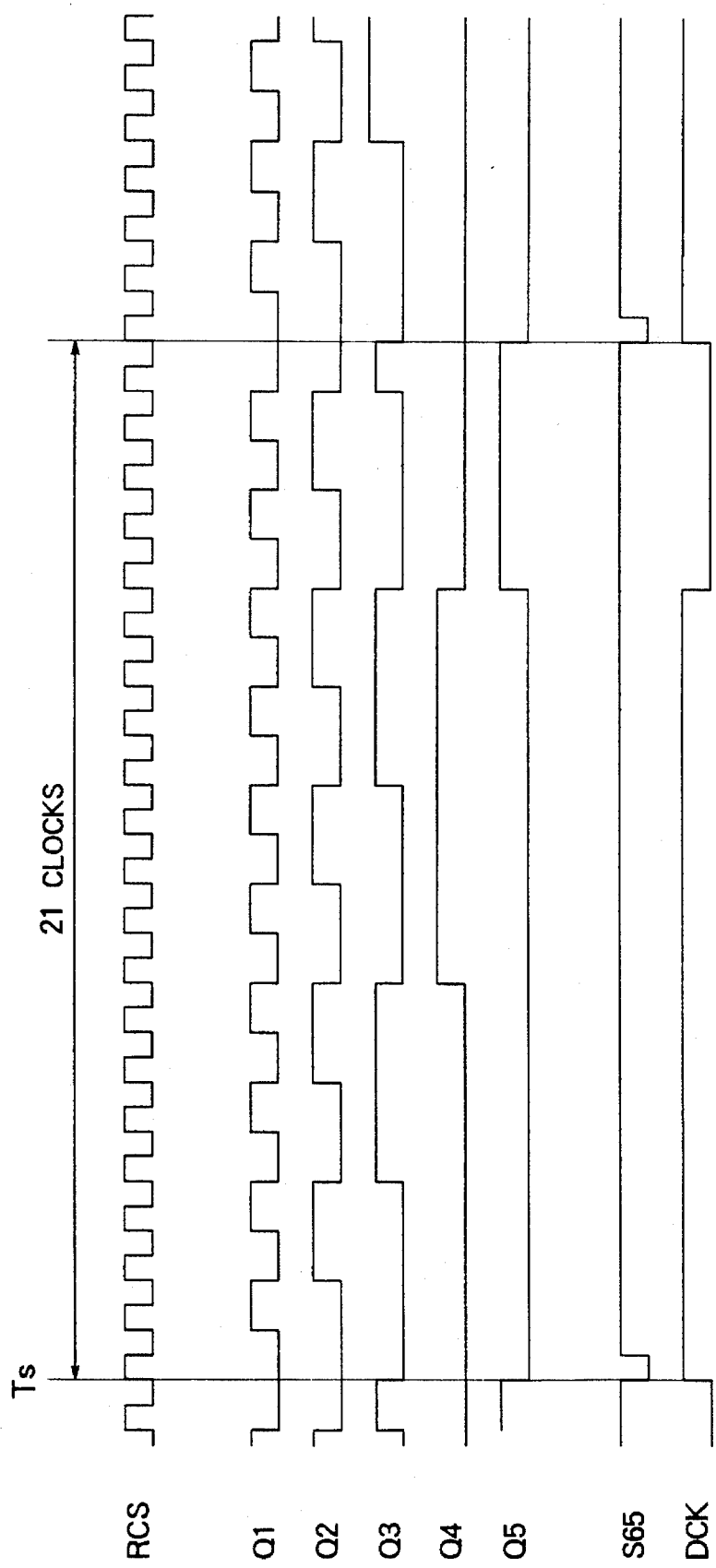
FIG. 7 shows signal waveforms for use in describing second operation of the variable frequency divider illustrated in FIG. 5.
Figure 8:
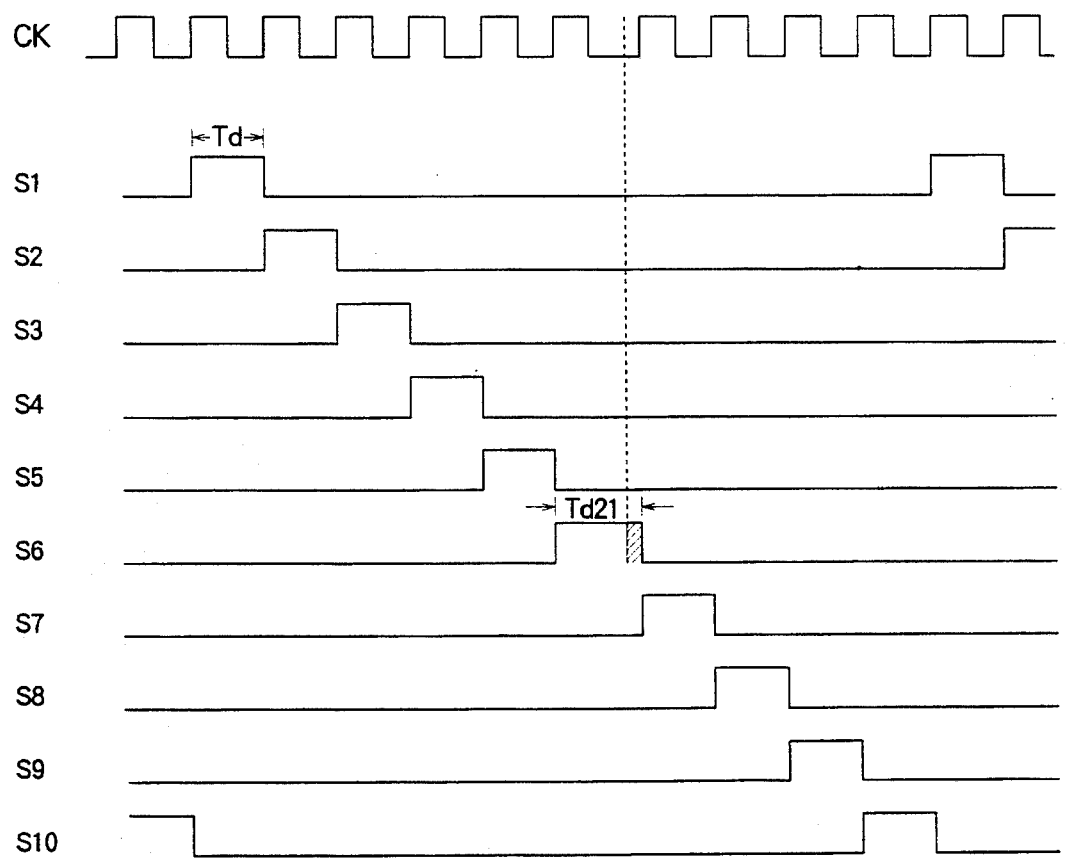
FIG. 8 shows signal waveforms for use in describing operation of the narrow-band filter illustrated in FIG. 3.

Referring to FIGS. 7 and 8 together with FIGS. 3 to 5, let the micro processor produce the first frequency designation signal FS1 having the logic one value and the second frequency designation signal FS2 having the logic zero value. In this event, the signal generating circuit 32 delivers the first ratio designation signal RS1 having the logic one value and the second ratio designation signal RS2 having the logic zero value. In other words, the first ratio designation signal RS1 has the logic one value in a time period during which the sixth switch driving signal S6 has the logic one value as apparent from FIG. 4. Furthermore, the sixth low-pass filter 13-6 carries out the filtering operation in a time period during which the sixth switch driving signal S6 has the logic one value. On the other hand, the variable frequency divider 31 selects the third frequency dividing ratio of $1/(m+1)$, namely, 1/21, in a time period during which the sixth low-pass filter 13-6 carries out the filtering operation. This means that the variable frequency divider 31 carries out the frequency dividing operation by the third frequency dividing ratio of 1/21 in a time period during which the sixth low-pass filter 13-6 carries out the filtering operation.

In FIG. 5, the NAND gate 65 produces the gate output signal S65 having the logic zero value at a twenty-first clock of the reference clock signal RCS from the start of the frequency dividing operation. By the gate output signal S65 having the logic zero value, the first through the fifth D-type flip-flop circuits are reset at the same time. As a result of the reset operation, the fifth D-type flip-flop circuit 55 produces the divided clock signal DCK through the inverter terminal Q. The divided clock signal DCK is the signal wherein the reference clock signal RCS is divided by the frequency dividing ratio of 1/21 in a time period during which the sixth low-pass filter 13-6 carries out the filtering operation. This means that the sixth filtering duration of the sixth low-pass filter 13-6 is extended for one cycle duration of the reference clock signal RCS. In other words, the sixth filtering duration becomes longer by one cycle duration than the first through the fifth filtering durations and the seventh through the tenth filtering durations which are depicted at Td in FIG. 8. Such an extended sixth filtering duration is depicted at Td21 in FIG. 8. Although the sixth high level duration is extended, the first through the tenth high level durations never overlap one another. As a result of the above operation, the narrow-band filter has the center frequency which is approximately equal to 5970 (=1200×10³/(20×10+1)) (Hz). In this case, the narrow-band filter serves as the detector for detecting the tone signal having the first tone frequency equal to 5970 (Hz).

Figure 9:
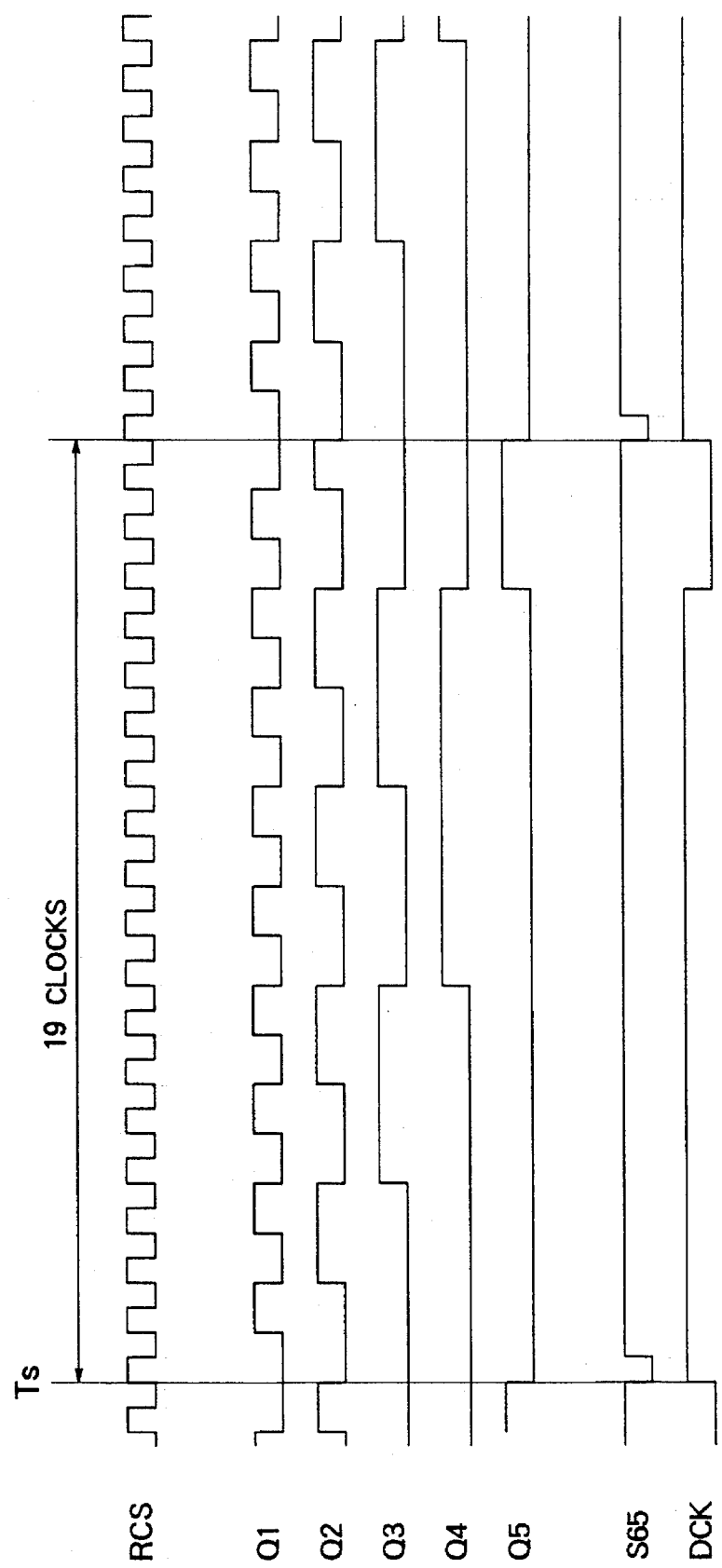
FIG. 9 shows signal waveforms for use in describing third operation of the variable frequency divider illustrated in FIG. 5.
Figure 10:
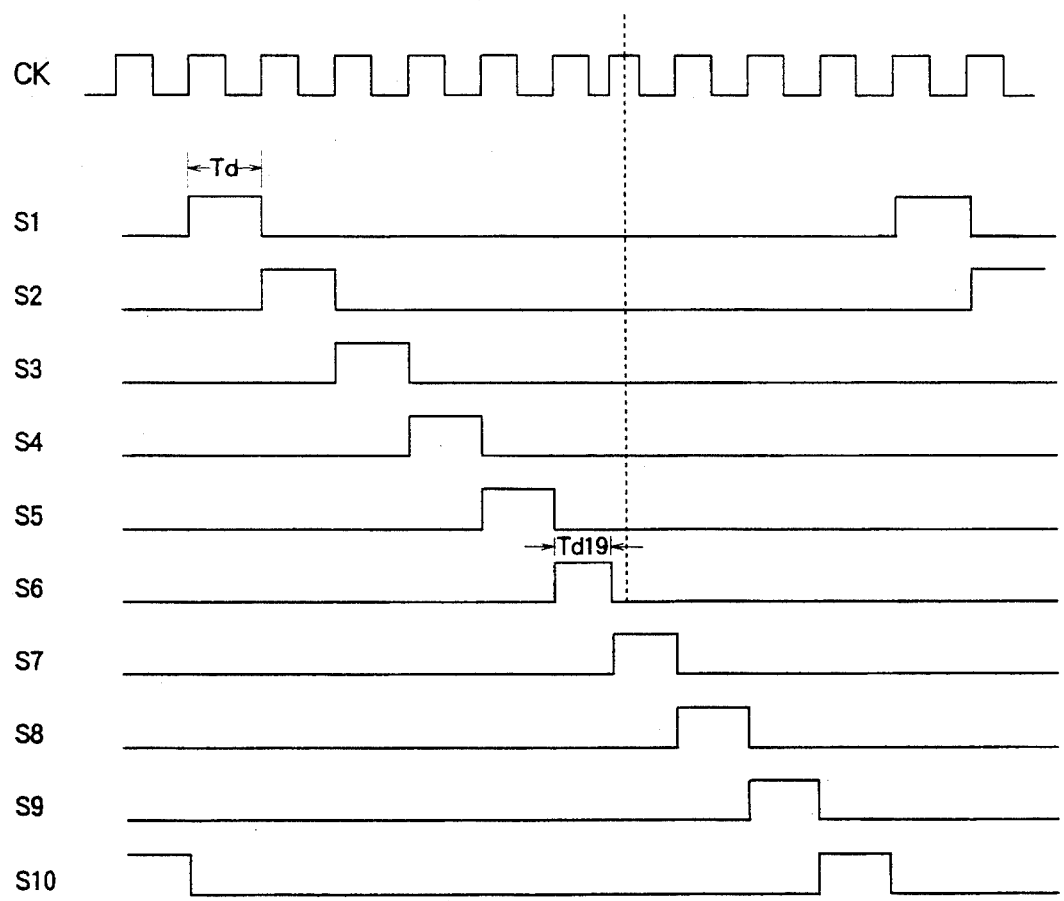
FIG. 10 shows signal waveforms for use in describing another operation of the narrow-band filter illustrated in FIG. 3.

Referring to FIGS. 9 and 10 together with FIGS. 3 to 5, let the micro processor produce the first frequency designation signal FS1 having the logic zero value and the second frequency designation signal FS2 having the logic one value. In the case, the signal generating circuit 32 delivers the first ratio designation signal RS1 having the logic zero value and the second ratio designation signal RS2 having the logic one value. In other words, the second ratio designation signal RS2 has the logic one value in a time period during which the sixth switch driving signal S6 has the logic one value. The sixth low-pass filter 13-6 carries out the filtering operation in a time period during which the sixth switch driving signal S6 has the logic one value. On the other hand, the variable frequency divider 31 selects the first frequency dividing ratio of 1/(m−1), namely, 1/19, in a time period during which the sixth low-pass filter 13-6 carries out the filtering operation. This means that the variable frequency divider 31 carries out the frequency dividing operation by the first frequency dividing ratio of 1/19 in a time period during which the sixth low-pass filter 13-6 carries out the filtering operation.

In FIG. 5, the NAND gate 65 produces the gate output signal S65 having the logic zero value at a nineteenth clock of the reference clock signal RCS from the start of the frequency dividing operation. The first through the fifth D-type flip-flop circuits 51 to 55 are reset at the same time by the gate output signal S65 having the logic zero value. As a result of the reset operation, the fifth D-type flip-flop circuit 55 produces the divided clock signal DCK through the inverter terminal Q. The divided clock signal DCK is the signal wherein the reference clock signal RCS is divided by the frequency dividing ratio of 1/19 in a time period during which the sixth low-pass filter 13-6 carries out the filtering operation. This means that the sixth filtering duration of the sixth low-pass filter 13-6 is shortened by one cycle duration of the reference clock signal RCS. In other words, the sixth filtering duration becomes shorter by one cycle duration than the first through the fifth filtering durations and the seventh through the tenth filtering durations which are depicted at Td in FIG. 10. Such a shortened sixth filtering duration is depicted at Td19 in FIG. 10. Although the sixth high level duration is shortened, the first through the tenth high level durations never overlap one another. As a result of the above operation, the narrow-band filter has the center frequency which is approximately equal to 6030 (=1200×10³/(20×10−1) (Hz). In this case, the narrow-band filter serves as the detector for detecting the tone signal having the third tone frequency equal to 6030 (Hz).

As apparent from the above description, the narrow-band filter according to this invention can change the center frequency in a narrow range without a complex PLL circuit and a frequency divider which operates in high speed. The narrow-band filter can detect all the first through the third tone frequencies of the tone signal. The narrow-band filter is therefore useful for detecting a plurality of tone signals, such as SAT signals which are used for the mobile radio telephone system of the AMPS type and which have extremely small frequency differences.

While this invention has thus far been described in conjunction with a preferred embodiment thereof, it will readily be possible for those skilled in the art to put this invention into practice in various other manners. For example, the variable frequency divider may have four or more kinds of frequency dividing ratios. The signal generating circuit may be implemented by another circuit different from the circuit illustrated in FIG. 4 and may select a plurality of switch driving signals from the first through the N-th switch driving signals. In this event, if the first and the second switch driving signals are selected, the first and the second filtering durations are changed.

What is claimed is:

1. A narrow-band filter supplied through an input terminal with an input signal having a predetermined frequency for filtering said input signal to produce a filtered signal through an output terminal and comprising:

first through n-th low-pass filters having the same filter characteristic which are connected in parallel to one another, where n represents a positive integer greater than unity;

switching means connected to said first through said n-th low-pass filters for time divisionally connecting said first through said n-th low-pass filters between said input and said output terminals, said first through said n-th low-pass filters time divisionally filtering said input signal for first through n-th filtering durations, respectively, and producing first through n-th time division filtered signals, respectively, collectively as said filtered signal; and control means connected to said switching means and supplied with a frequency designation signal designating said predetermined frequency for controlling said switching means to vary at least one of said first through said n-th filtering durations in accordance with said frequency designation signal, such that said narrow-band filter has center frequency which varies in accordance with said at least one of said first through said n-th filtering durations.

2. The narrow-band filter as claimed in claim 1, wherein said control means comprises:

an oscillator for generating a reference clock signal having a reference frequency;

a variable frequency divider connected to said oscillator and supplied with a ratio designation signal designating a frequency dividing ratio and said reference clock signal, said variable frequency divider frequency dividing said reference clock signal in accordance with said frequency dividing ratio to produce a divided clock signal having a divided frequency defined by said frequency dividing ratio;

a ring counter connected to said variable frequency divider for time divisionally generating first through n-th switch driving signals in response to said divided clock signal to supply said first through said n-th switch driving signals to said switching means, said first through said n-th switch driving signals having first through n-th phases which are different from one another and having first through n-th high level durations which correspond to said first through said n-th filtering durations, respectively; and signal generating means connected to said ring counter and supplied with said frequency designation signal for generating said ratio designation signal in accordance with said frequency designation signal and at least one of said first through said n-th switch driving signals.

3. The narrow-band filter as claimed in claim 2, wherein said switching means comprises:

first through n-th input switches connected between said input terminal and said first through said n-th low-pass filters, respectively; and first through n-th output switches connected between said output terminal and said first through said n-th low-pass filters, respectively, said first through said n-th input switches being time divisionally put into an on state one by one in synchronism with said first through said n-th switch driving signals, respectively, said first through said n-th output switches being time divisionally put into an on state one by one in synchronism with said first through said n-th switch driving signals, respectively.

4. The narrow-band filter as claimed in claim 3, wherein said oscillator is implemented by a crystal oscillator.

5. The narrow-band filter as claimed in claim 1, wherein said control means controls said switching means to change one of said first through said n-th filtering durations in accordance with said frequency designation signal.

6. The narrow-band filter as claimed in claim 1, wherein said control means controls said switching means to increase by approximately 0.5% a center frequency of said narrow-band filter.

7. The narrow-band filter as claimed in claim 1, wherein said control means controls said switching means to decrease by approximately 0.5% a center frequency of said narrow-band filter.

* * * * *

UNITED STATES PATENT AND TRADEMARK OFFICE
CERTIFICATE OF CORRECTION

PATENT NO. : 5,491,453
DATED : February 13, 1996
INVENTOR(S) : Masaki Ichihara

It is certified that error appears in the above-indentified patent and that said Letters Patent is hereby corrected as shown below:

Column 8, line 12, delete "Q" and insert -- $\overline{Q}$ --.

Column 8, line 62, delete "Q" and insert -- $\overline{Q}$ --.

Column 9, line 43, delete "Q" and insert -- $\overline{Q}$ --.

Signed and Sealed this

Ninth Day of July, 1996

Attest:

BRUCE LEHMAN

*Attesting Officer*     Commissioner of Patents and Trademarks